United States Patent
Seki et al.

(10) Patent No.: US 11,404,462 B2
(45) Date of Patent: Aug. 2, 2022

(54) IMAGING ELEMENT AND IMAGING APPARATUS

(71) Applicant: SONY SEMICONDUCTOR SOLUTIONS CORPORATION, Kanagawa (JP)

(72) Inventors: Yuichi Seki, Kumamoto (JP); Yoichi Ootsuka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 72 days.

(21) Appl. No.: 16/610,668

(22) PCT Filed: May 2, 2018

(86) PCT No.: PCT/JP2018/017515
§ 371 (c)(1),
(2) Date: Nov. 4, 2019

(87) PCT Pub. No.: WO2018/216444
PCT Pub. Date: Nov. 29, 2018

(65) Prior Publication Data
US 2020/0075653 A1  Mar. 5, 2020

(30) Foreign Application Priority Data
May 25, 2017 (JP) .............................. JP2017-103469

(51) Int. Cl.
*H01L 27/14* (2006.01)
*H01L 27/146* (2006.01)
(Continued)

(52) U.S. Cl.
CPC .......... *H01L 27/14621* (2013.01); *G02B 5/20* (2013.01); *H01L 27/14605* (2013.01); *H04N 9/07* (2013.01)

(58) Field of Classification Search
CPC ........ H01L 27/14621; H01L 27/14605; G02B 5/20; H04N 9/07
See application file for complete search history.

(56) References Cited

U.S. PATENT DOCUMENTS

2011/0298074 A1    12/2011  Funao
2012/0075509 A1*  3/2012  Ito ..................... H01L 27/14621
                                                     348/265
(Continued)

FOREIGN PATENT DOCUMENTS

JP   2000-241619   9/2000
JP   2011-258728   12/2011
JP   2012-191136   10/2012

OTHER PUBLICATIONS

International Search Report prepared by the Japan Patent Office dated Jul. 3, 2018, for International Application No. PCT/JP2018/017515.

*Primary Examiner* — Victor A Mandala
*Assistant Examiner* — Colleen E Snow
(74) *Attorney, Agent, or Firm* — Sheridan Ross P.C.

(57) ABSTRACT

Image quality of an imaging element having a configuration in which pixels having color filters are arranged two-dimensionally is prevented from being lowered. An imaging element includes a plurality of pixels and incident light attenuation sections. The pixel includes a color filter transmitting incident light having a predetermined wavelength, and a photoelectric conversion section that produces an electric charge according to the light transmitted through the color filter. The incident light attenuation section is disposed between the color filters of the adjacent pixels, is configured to be different in surface height from the color filters, and attenuates light not transmitted through the color filter but (Continued)

incident on the photoelectric conversion section of the pixel where the color filter is disposed.

20 Claims, 12 Drawing Sheets

(51) Int. Cl.
  *G02B 5/20* (2006.01)
  *H04N 9/07* (2006.01)

(56) References Cited

U.S. PATENT DOCUMENTS

| | | |
|---|---|---|
| 2012/0235266 A1 | 9/2012 | Ootsuka |
| 2012/0267745 A1* | 10/2012 | Tsuji ................. H01L 27/14627 |
| | | 257/432 |
| 2014/0367821 A1 | 12/2014 | Ootsuka |
| 2020/0013821 A1* | 1/2020 | Oota ................. H01L 31/02164 |

* cited by examiner

F I G . 1
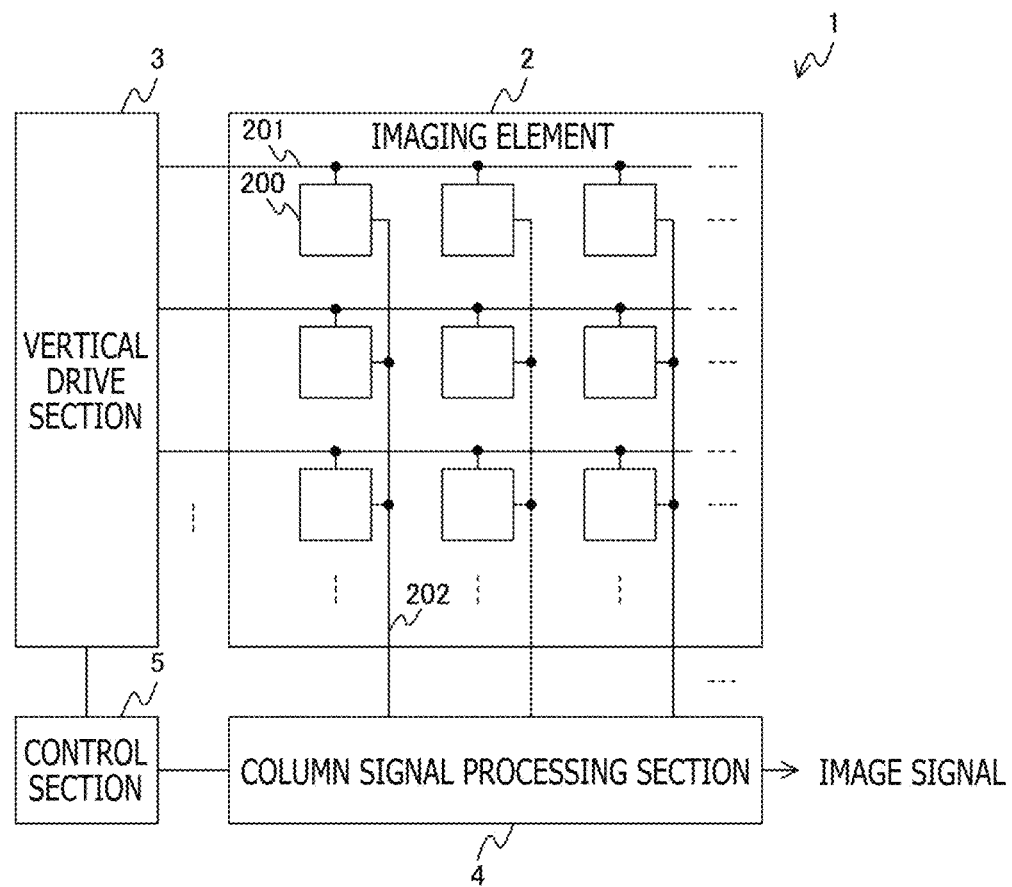

a b a b c d a b

IMAGING ELEMENT AND IMAGING APPARATUS

CROSS REFERENCE TO RELATED APPLICATIONS

This application is a national stage application under 35 U.S.C. 371 and claims the benefit of PCT Application No. PCT/JP2018/017515 having an international filing date of 2 May 2018, which designated the United States, which PCT application claimed the benefit of Japanese Patent Application No. 2017-103469 filed 25 May 2017, the entire disclosures of each of which are incorporated herein by reference.

TECHNICAL FIELD

The present technology relates to an imaging element and an imaging apparatus. Specifically, the present technology relates to an imaging element in which pixels having color filters are arranged two-dimensionally, and to an imaging apparatus.

BACKGROUND ART

In the past, an imaging element in which pixels producing an image signal of light of a wavelength selected by a color filter are arranged and a color image signal is produced has been used. For example, there is used an imaging element in which pixels including a color filter transmitting light is any one color of red, green or blue and a photoelectric conversion section producing an electric charge according to the light transmitted through the color filter are arranged in a two-dimensional lattice pattern based on a predetermined rule. In this case, image signals corresponding to red, green and blue are respectively generated, and full-color image data can be acquired. Hereinafter, pixels including the color filters corresponding to red, green and blue will be referred to as a red pixel, a green pixel, and a blue pixel, respectively. An arrangement system in which these pixels are formed in a tetragonal shape, the green pixels are arranged in a checkered pattern, and the red pixels and the blue pixels are disposed between the green pixels is called a Bayer array, and is used as the above-mentioned predetermined rule.

In such an imaging element, in order to prevent generation of defective image quality caused by peeling of the color filters, an imaging element in which the color filters adjacent to each other in an oblique direction are coupled together is used. Specifically, an imaging element which is configured in the Bayer array and in which color filters of green pixels are linked together is used (see, for example, PTL 1).

CITATION LIST

Patent Literature

[PTL 1]
Japanese Patent Laid-open No. 2000-241619

SUMMARY

Technical Problem

In the related art mentioned above, the color filters corresponding to the green light in the checkered pattern are linked in the regions of corners of the pixel, and are configured to be color filters less susceptible to peeling. However, since linking regions of the color filters corresponding to the green light are formed at the four corners of the pixel, the light incident on a photoelectric conversion section of the pixel is reduced, and sensitivity is lowered. This is because the photoelectric conversion section is disposed at a central portion of the pixel, and the light transmitted through the linking regions cannot reach the photoelectric conversion section disposed at the central portion. In the related art mentioned above, therefore, there is a problem that a lowering in image quality is generated due to a lowering in sensitivity.

The present technology has been made in consideration of the above-mentioned problem. It is an object of the present technology to prevent a lowering in image quality of an imaging element in which pixels having color filters are arranged two-dimensionally.

Solution to Problem

According to a first aspect of the present technology, which has been made for solving the above-mentioned problem, there is provided an imaging element including: a plurality of pixels including a color filter that transmits incident light having a predetermined wavelength, and a photoelectric conversion section that produces an electric charge according to the light transmitted through the color filter; and an incident light attenuation section that is disposed between the color filters of the adjacent pixels, is configured to be different in surface height from the color filters, and attenuates light not transmitted through the color filter but incident on the photoelectric conversion section of the pixel where the color filter is disposed.

In addition, according to a second aspect of the present technology, there is provided an imaging apparatus including: a plurality of pixels including a color filter that transmits incident light having a predetermined wavelength, and a photoelectric conversion section that produces an electric charge according to the light transmitted through the color filter; an incident light attenuation section that is disposed between the color filters of the adjacent pixels, is configured to be different in surface height from the color filters, and attenuates light not transmitted through the color filter but incident on the photoelectric conversion section of the pixel where the color filter is disposed; and a processing section that processes an image signal which is a signal according to the produced electric charge.

As described above, in the present technology, the incident light attenuation section different in surface height from the color filters is disposed between the adjacent color filters. For example, in the case where incident light attenuation sections lower in surface height than the color filters are disposed, the film thickness of the incident light attenuation sections is reduced while securing a film thickness required for the color filters. In this instance, there is obtained an effect that the incident light is taken in through the portion of a step between the color filter and the incident light attenuation section. As a result, image quality is expected to be improved by improved sensitivity of the pixels.

In addition, in the case where incident light attenuation sections higher in surface height than the color filters are disposed, there is obtained an effect that the light incident on the color filter by obliquely passing through the region where the incident light attenuation section is disposed is attenuated. Normally, obliquely incident light is light from a subject scattered by, for example, a glass protecting the imaging element, and corresponds to optical noise. By preventing the incidence of such light, image quality is expected to be improved.

Advantageous Effect of Invention

According to the present technology, an excellent effect of improving the image quality of as imaging element in which pixels having color filters are arranged two-dimensionally is produced.

BRIEF DESCRIPTION OF DRAWINGS

FIG. 1 is a figure depicting a configuration example of an imaging apparatus in an embodiment of the present technology.

DESCRIPTION OF EMBODIMENTS

Figure 2:
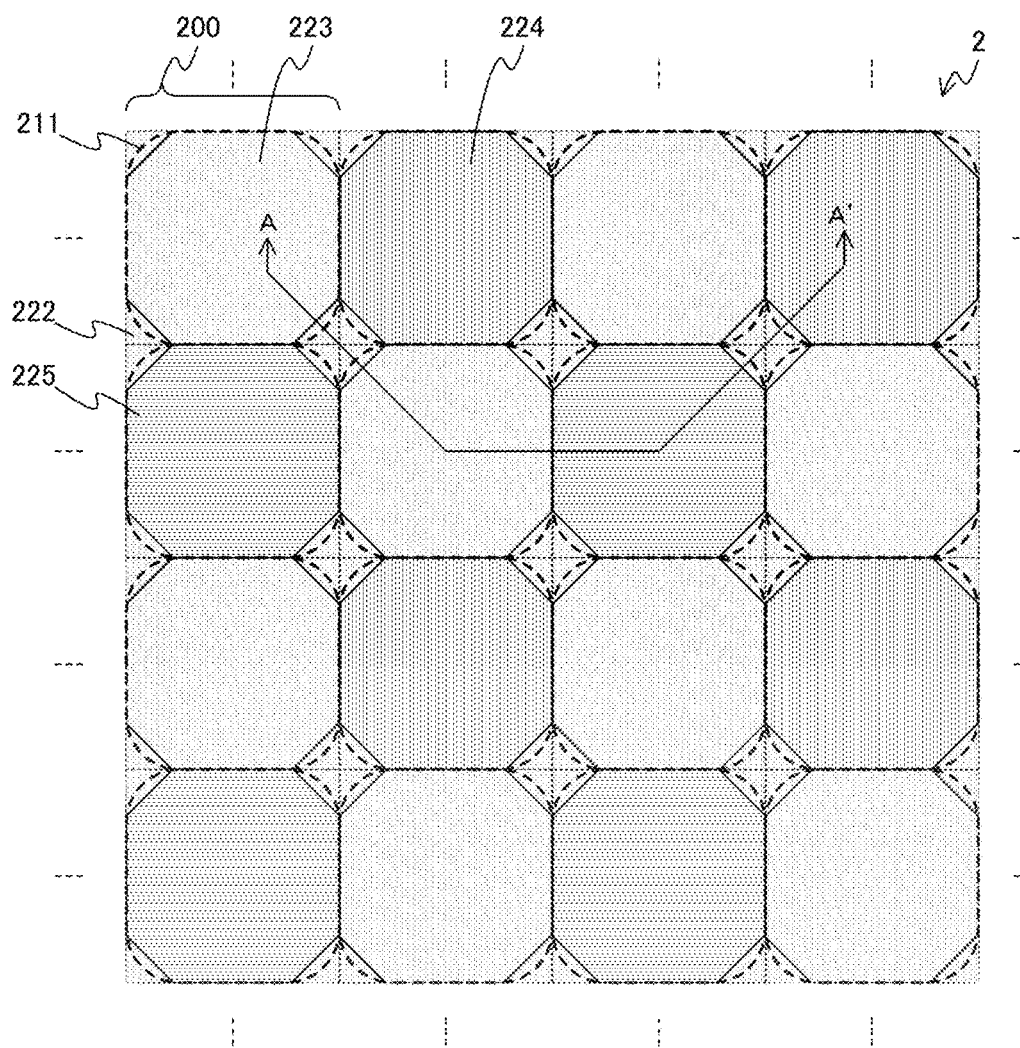
FIG. 2 is a figure depicting a configuration example of an imaging element in a first embodiment of the present technology.

Modes for carrying out the present technology (hereinafter referred to as embodiments) will be described below referring to the drawings. In the following drawings, the same or similar parts are denoted by the same or similar reference signs. It is to be noted, however, that the drawings are schematic, and the dimensional ratios of the parts and the like are not necessarily coincident with the actual ones. In addition, the drawings naturally include parts of which the dimensional relations or ratios are different from drawing to drawing. Besides, the embodiments will be described in the following order.

1. First Embodiment
2. Second Embodiment
3. Third Embodiment

1. First Embodiment

[Configuration of Imaging Apparatus]

FIG. 1 is a figure depicting a configuration example of an imaging apparatus in an embodiment of the present technology. The imaging apparatus 1 in the figure includes an imaging element 2, a vertical drive section 3, a column signal processing section 4, and a control section 5.

The imaging element 2 has a configuration in which pixels 200 are arranged in a two-dimensional lattice pattern. This pixel 200 produces an image signal according to light from a subject, and includes a photoelectric conversion section (a photoelectric conversion section 242 to be described later) that produces an electric charge according to the light applied, and a pixel circuit that produces an image signal based on the electric charge produced by the photoelectric conversion section. Details of the configuration of the pixel 200 will be described later.

In addition, the imaging element 2 has signal lines 201 and 202 arranged in an XY matrix pattern, and the signal lines are wired with respect to the plurality of pixels 200. Here, the signal lines 201 are signal lines that transmit control signals for controlling the pixel circuits of the pixels 200, are arranged on the basis of each row of the pixels 200 disposed in the imaging element 2, and are wired in common with respect to the plurality of pixels 200 arranged in one row. Besides, the signal lines 202 are signal lines that transmit image signals produced by the pixel circuits of the pixels 200, are arranged on the basis of each column of the pixels 200 disposed in the imaging element 2, and are wired in common with respect to the plurality of pixels 200 arranged in one column.

The vertical drive section 3 produces control signals for the pixels 200, and outputs the control signals through the signal lines 201. This vertical drive section 3 produces and outputs control signals which are different on the basis of each row of the pixels 200 disposed in the imaging element 2.

The column signal processing section 4 processes the image signals produced by the pixels 200, and outputs the processed image signals. The processing in the column signal processing section 4 corresponds, for example, to an analog-digital conversion processing for converting an analog image signal produced by the pixels 200 into a digital image signal. The image signal outputted from the column signal processing section 4 corresponds to an output signal from the imaging apparatus 1. Note that the column signal processing section 4 is an example of the processing section described in claims.

The control section 5 controls the vertical drive section 3 and the column signal processing section 4. This control section 5 produces and outputs control signals for the vertical drive section 3 and the column signal processing section 4, to perform control.

[Configuration of Imaging Element]

FIG. 2 is a figure depicting a configuration example of an imaging element in the first embodiment of the present technology. The figure represents the manner of a light receiving surface receiving light from a subject, in the imaging element 2. Broken-line rectangles in the figure represent divisions of the pixels 200. As represented in the figure, a plurality of pixels 200 is arranged in a two-dimensional lattice pattern on the light receiving surface of the imaging element 2.

In the figure, the pixel 200 includes an on-chip lens 211 and any one of color filters 223 to 225. The on-chip lenses 211 are arranged on a pixel 200 basis, and focus the light incident on the imaging element 2 from the subject onto photoelectric conversion sections to be described later.

The color filters 223 to 225 are optical filters each of which is disposed between the on-chip lens 211 and the photoelectric conversion section, and transmits light from a subject having a predetermined wavelength. On the color filters 223 to 225 in the figure, the light from the subject is incident through the on-chip lenses 211. Here, the color filters 223 to 225 are different from one another in the wavelength of the light transmitted therethrough. For example, the color filters 223 to 225 can be color filters which transmit green light, blue light or red light, respectively. To the green pixel, blue pixel and red pixel described above, the pixels 200 where the color filters 223 to 225 are disposed correspond respectively. In addition, these pixels 200 are configured in the aforementioned Bayer array.

Furthermore, the imaging element 2 includes incident light attenuation sections 222. The incident light attenuation sections 222 are elements for attenuating the light that is not transmitted through the color filters 223 to 225 disposed at the pixels 200 but is incident on the photoelectric conversion sections of the pixels. Besides, these incident light attenuation sections 222 are each disposed between the color filters 223 and the like of the adjacent pixels 200. In the imaging element 2 in the figure, the incident light attenuation section 222 is disposed in a region of a corner of four adjacent pixels 200.

The region in which this incident light attenuation section 222 is disposed is a region including a gap between a plurality of on-chip lenses 211. The gaps between the on-chip lenses 211 are called ineffective regions. In the case where the incident light attenuation sections 222 are not disposed in the imaging element 2, the light not focused by the on-chip lenses 211 is incident on the inside of the pixels 200 through the ineffective regions. Since the photoelectric conversion section is disposed at a central portion of the pixel 200 as described later, the light applied via the ineffective regions is not incident on the photoelectric conversion section. However, the light obliquely incident on the light receiving surface reaches the photoelectric conversion section through the ineffective regions and becomes light mixing into the photoelectric conversion section without passing through the color filter 223 or the like disposed for its own pixel 200. As a result, color mixing occurs in which an image signal based on lights of different wavelengths is generated. In view of this, the incident light attenuation sections 222 are disposed to attenuate the light incident through the ineffective regions, reducing the light mixing into the photoelectric conversion sections and preventing color mixing. Note that even in an imaging element having a configuration in which the on-chip lenses 211 are not disposed for the pixels 200, by disposing the incident light attenuation sections 222, mixing of the light obliquely incident from the adjacent pixels 200 can be prevented.

On the other hand, since the light incident on the ineffective regions from the front side is also attenuated by the incident light attenuation sections 222, it causes a lowering in sensitivity. In view of this, the incident light attenuation sections 222 are configured to be different in surface height from the color filter 223. In the present embodiment, the incident light attenuation sections 222 are set lower in surface height than the color filters 223 to 225. Further, the on-chip lenses 211 are formed in regions including the regions where the incident light attenuation sections 222 are disposed. As a result, a lowering in sensitivity can be prevented while preventing color mixing in the pixels 200.

Details of the configuration of the incident light attenuation section 222 will be described later.

As represented in the figure, the incident light attenuation section 222 is configured in a tetragonal shape in light receiving surface view. For example, a color filter attenuating light of a specific wavelength can be used as this incident light attenuation section 222. For instance, as represented in the figure, a color filter transmitting green light can be used as the incident light attenuation section 222. In this case, color mixing by red light and blue light can be prevented. On the other hand, green light can be transmitted, and, therefore, sensitivity with respect to green light can be improved. In addition, not only the aforementioned primary-color color filter but also a complementary-color color filter can be used as the incident light attenuation section 222. Besides, a film including a light-shielding material dispersed in a resin can be used to constitute this incident light attenuation section 222. As the light-shielding material, there can be used, for example, carbon black, titanium black, and metal oxides (e.g., magnetite type triiron tetraoxide ($Fe_3O_4$)). In addition, by using a photosensitive resist as the above-mentioned resin, the incident light attenuation section 222 can be formed by photolithography, similarly to the color filters 223 and the like. Details of producing methods for the color filters 223 to 225 and the incident light attenuation sections 222 will be described later.

[Configuration of Pixel]

Figure 3:
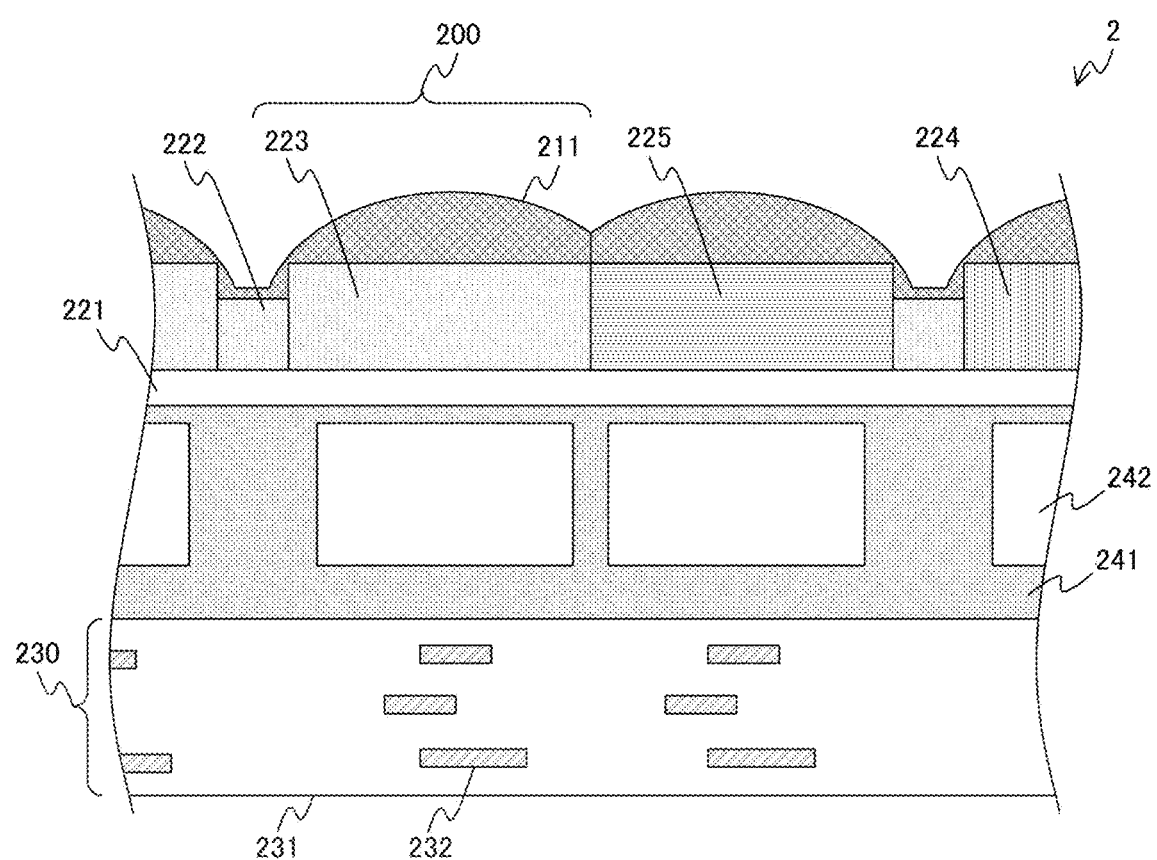
FIG. 3 is a figure depicting a configuration example of a pixel in the first embodiment of the present technology.

FIG. 3 is a figure depicting a configuration example of the pixel in the first embodiment of the present technology. The figure is a schematic sectional view of the pixel 200 taken along line A-A' of FIG. 2. The pixel 200 in the figure further includes a semiconductor substrate 241, a wiring region 230 and a planarization film 221, in addition to the on-chip lens 211, the incident light attenuation section 222 and the color filters 223 to 225.

The semiconductor substrate 241 includes the photoelectric conversion sections described in FIG. 1 (the photoelectric conversion sections 242 in the figure) and semiconductor elements (not illustrated) constituting the pixel circuits. As the semiconductor substrate 241, there can be used, for example, a semiconductor substrate configured using a P-type semiconductor. In this case, an N-type semiconductor region formed in the semiconductor substrate 241 can be used as the photoelectric conversion section 242. When light from a subject is applied on a PN junction part formed at the boundary between the semiconductor substrate 241 and the photoelectric conversion section 242, an electric charge according to the applied light is generated through photoelectric conversion, and is held in the photoelectric conversion section 242. An image signal based on this electric charge held is produced by the pixel circuit, and is outputted as an image signal of the pixel 200.

The wiring region 230 is a region in which the signal lines 201 and 202 described in FIG. 1 are formed. This wiring region 230 includes wiring layers 232 and an insulating layer 231. The wiring layers 232 are formed using a metal or the like, and constitute the signal lines 201 and the like. As represented in the figure, these wiring layers 232 can be multi-layer wiring. The insulating layer 231 insulates the wiring layers 232 from one another. For this insulating layer, silicon oxide ($SiO_2$) and BPSG (Boron Phosphorus Silicon Glass) which are light-transmitting can be used. As just described, the imaging element 2 in which the color filters 223 and the on-chip lenses 211 are formed on a back surface different from the surface where the wiring region 230 of the semiconductor substrate 241 is formed and in which light is applied to the photoelectric conversion sections 242 from the back surface is called a back-illuminated imaging element.

The planarization film 221 is disposed between the color filters 223 to 225 and the semiconductor substrate 241, protects the semiconductor substrate 241 and planarizes the surface of the semiconductor substrate 241.

The color filters 223 to 225 and the incident light attenuation sections 222 are formed on the surface of the planarization film 221. Of these components, the incident light attenuation sections 222 are formed in the same layer as the color filters 223 to 225, and are formed to be lower in surface height than the color filters 223 and the like. In addition, the on-chip lenses 211 are formed adjacently to the color filters 223 to 225 and the incident light attenuation sections 222. As mentioned above in FIG. 2, a configuration can be adopted in which an end portion of the on-chip lens 211 is disposed in a region where the incident light attenuation section 222 is formed. In addition, a configuration can be adopted in which the surfaces of the incident light attenuation sections 222 are covered with the same material as that of the on-chip lenses 211.

Note that a central part of the figure depicts the condition of a region where the green pixel (the pixel 200 at which the color filter 223 is disposed) and the blue pixel (the pixel 200 at which the color filter 225 is disposed) are adjacent to each other at a side. In this region, the incident light attenuation section 222 is not disposed, and the two on-chip lenses 211 are coupled to each other.

Since the color filters 223 to 225 in the figure are higher in surface height than the incident light attenuation sections 222, this structure may be deemed as a configuration in which part of the regions of the on-chip lenses 211 is replaced by the color filters 223 or the like. In this case, the region including the color filters 223 and the like and the on-chip lenses 211 can be thinned, as compared to the case where the color filter 223 and the incident light attenuation sections 222 are equal in surface height. For example, in the case where a film thickness necessary for securing a filter effect in the color filter 223 or the like is greater than the thickness of the incident light attenuation sections 222, the height of the imaging element 2 can be reduced while securing film thicknesses required respectively for the color filters 223 and the like and the incident light attenuation sections 222.

[Attenuation of Incident Light]

Figure 4:
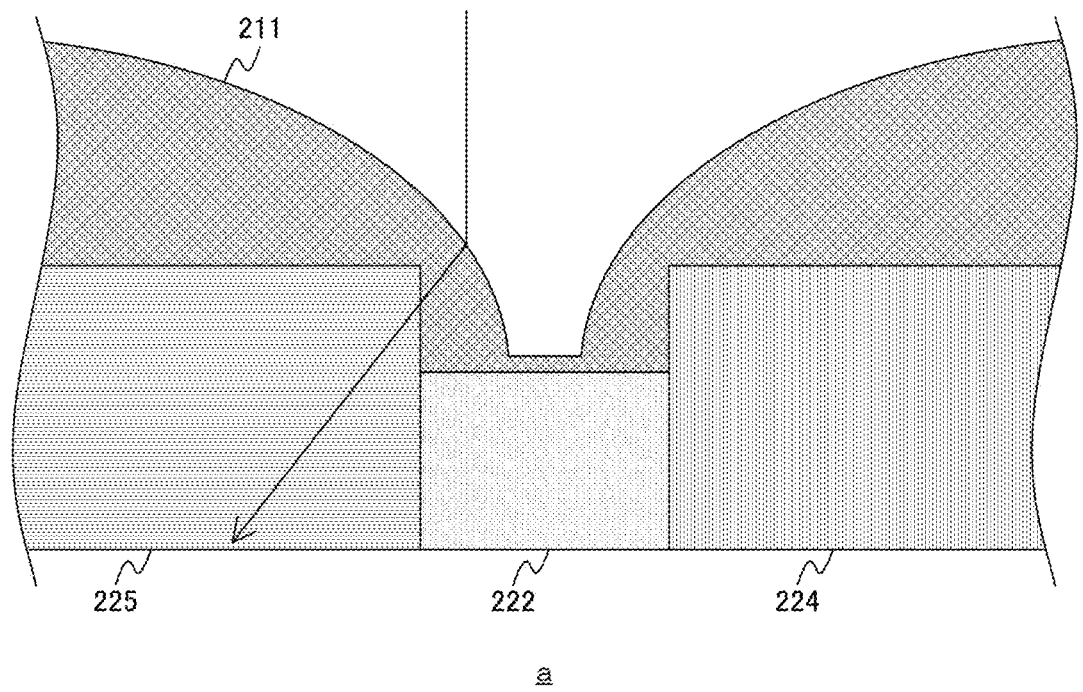
FIG. 4 is a figure depicting an example of incident light in the first embodiment of the present technology.
Figure 4:
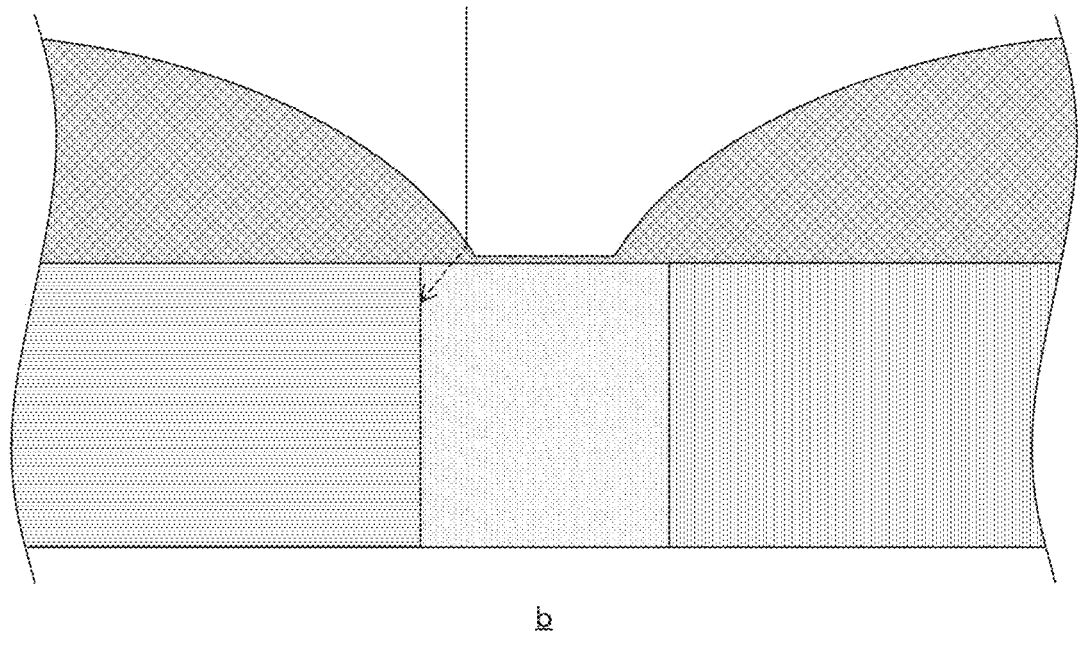

FIG. 4 is a figure depicting an example of incident light in the first embodiment of the present technology. This figure is a figure representing the manner of light incident on a region where the incident light attenuation section 222 is disposed in the pixel 200. In a of the figure, there is represented an example of the case where the incident light attenuation section 222 is lower in surface height than the color filter 225, and the arrow in a of the figure represents the light incident on the region. As represented in a of the figure, the light incident on the on-chip lens 211 in the region where the incident light attenuation section 222 is disposed can be transmitted through the color filter 225 without being attenuated by the incident light attenuation section 222, and can reach the photoelectric conversion section 242 (not illustrated). In other words, the light from a subject is applied via the part of a step between the color filter 225 and the incident light attenuation section 222. As a result, part of the light incident on the region can be focused on the photoelectric conversion section 242.

In b of the figure, there is represented an example of the case where the incident light attenuation section 222 is equal in surface height to the color filter 225. In b of the figure, the light being incident on the region where the incident light attenuation section 222 is disposed and being focused by the on-chip lens 211 is incident on the incident light attenuation section 222 before reaching the color filter 225. The dotted line in b of the figure represents the manner in which the light is attenuated by the incident light attenuation section 222. Thus, with the incident light attenuation section 222 set to be lower in surface height than the color filter 225, the light incident on the region where the incident light attenuation section 222 is disposed can be focused on the photoelectric conversion section 242, and a lowering in sensitivity can be prevented.

[Producing Method for Incident Light Attenuation Section]

Figure 5:
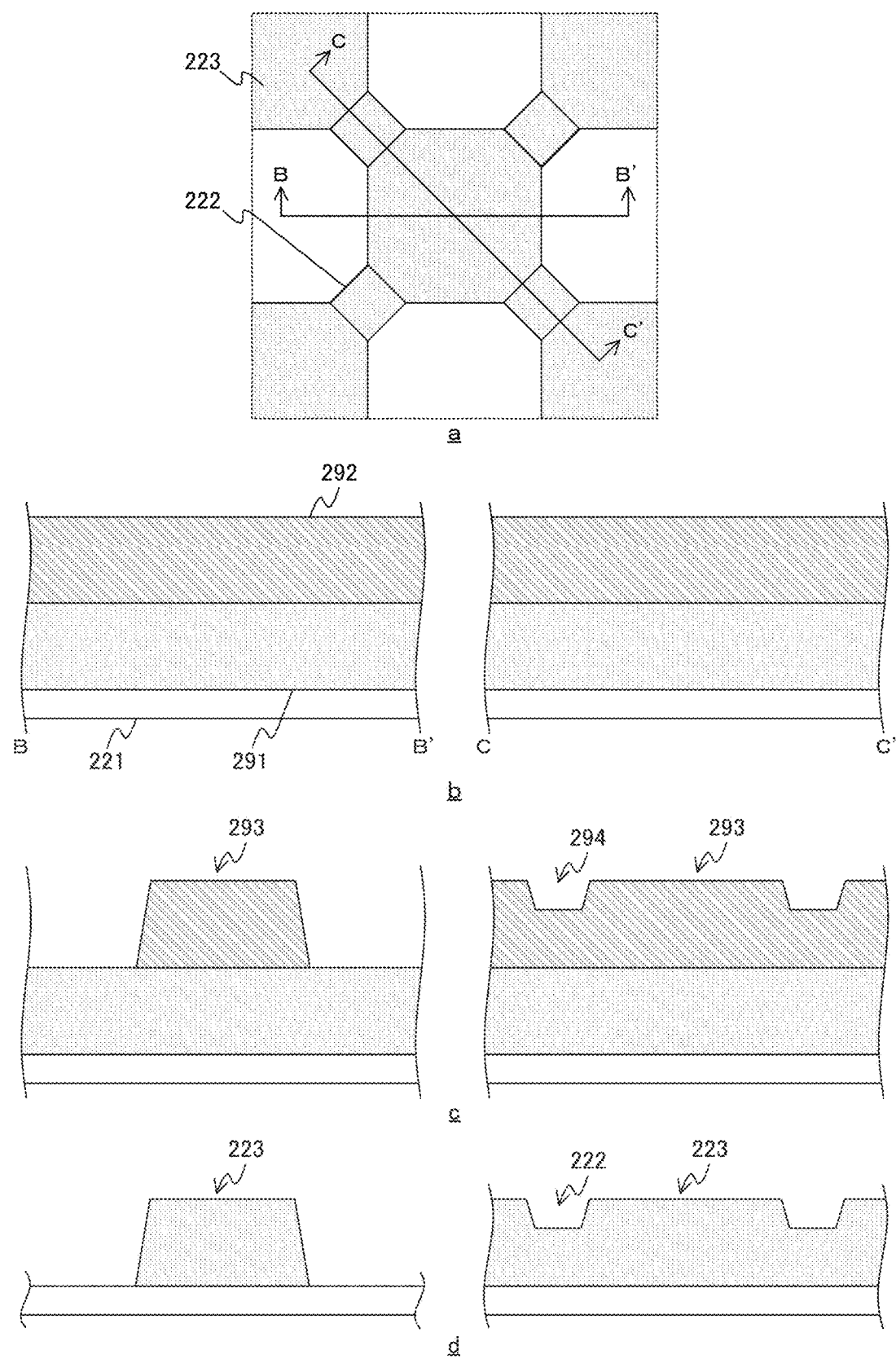
FIG. 5 is a figure depicting an example of a producing method for an incident light attenuation section in the first embodiment of the present technology.

FIG. 5 is a figure depicting an example of a producing method for the incident light attenuation section in the first embodiment of the present technology. This figure is a figure representing an example of the case of simultaneously forming the incident light attenuation sections 222 and the color filters 223, and is a figure representing an example of the case where the semiconductor substrate 241 formed with the wiring region 230 and the planarization film 221 is formed with the incident light attenuation sections 222 and the like. In addition, a of the figure is a figure representing the layout of the subject incident light attenuation sections 222 and color filters 223. A producing method for the incident light attenuation sections 222 and the like will be described, taking as an example the sections along lines B-B' and C-C' described in a of the figure. In each of b to d of the figure, the figure on the left side represents a configuration of the section along line B-B', and the figure on the right side represents a configuration of the section along line C-C'.

First, in b of the figure, a color resist 291 as a material for the color filter 223 is applied onto the planarization film 221 by spin coating, for example. As this color resist 291, a non-photosensitive resist can be used. Next, a photoresist 292 is applied by spin coating, for example. As this photoresist 292, a positive-type photoresist of which non-exposed portions are left upon development after exposure can be used (b of the figure).

Next, exposure is conducted and development is performed (c of the figure). At the time of this exposure, a halftone mask is used, so as to adjust the film thickness of the photoresist 292 after development. Specifically, a halftone mask of which the portion of a region 294 depicted in b of the figure is set higher in transmittance is used, to perform a residual film control such that the film thickness of the photoresist 292 in the region 294 is thinner than the photoresist 292 in a region 293. Note that the region 293 and the region 294 are regions where the color filter 223 and the incident light attenuation section 222 are formed, respectively.

Next, etching is conducted using the developed photoresist 292 as a mask (d of the figure). As this etching, dry etching can be used. By this dry etching, the photoresist 292 and the color resist 291 are simultaneously etched. Specifically, the photoresist 292 serves as a mask, and etching of the color resist 291 is performed. The dry etching is continued until the photoresist 292 in the region 293 is removed. As a result the shape of the photoresist 292 can be transferred to the color resist 291. Thereafter, the residue of the photoresist 292 is removed by, for example, application of solvent. By the steps described above, the incident light attenuation sections 222 can be formed. Note that the producing method for the incident light attenuation sections 222 is not limited to this example. For example, a negative-type photoresist 292 can also be used.

Thereafter, the color filters 224 and 225 are formed. The color filters 224 and 225 can be formed by applying photosensitive color resists, and performing exposure and development. In addition, they can also be formed by dry etching, similarly to the color filter 223 mentioned above.

[Producing Method for On-Chip Lens]

Figure 6:
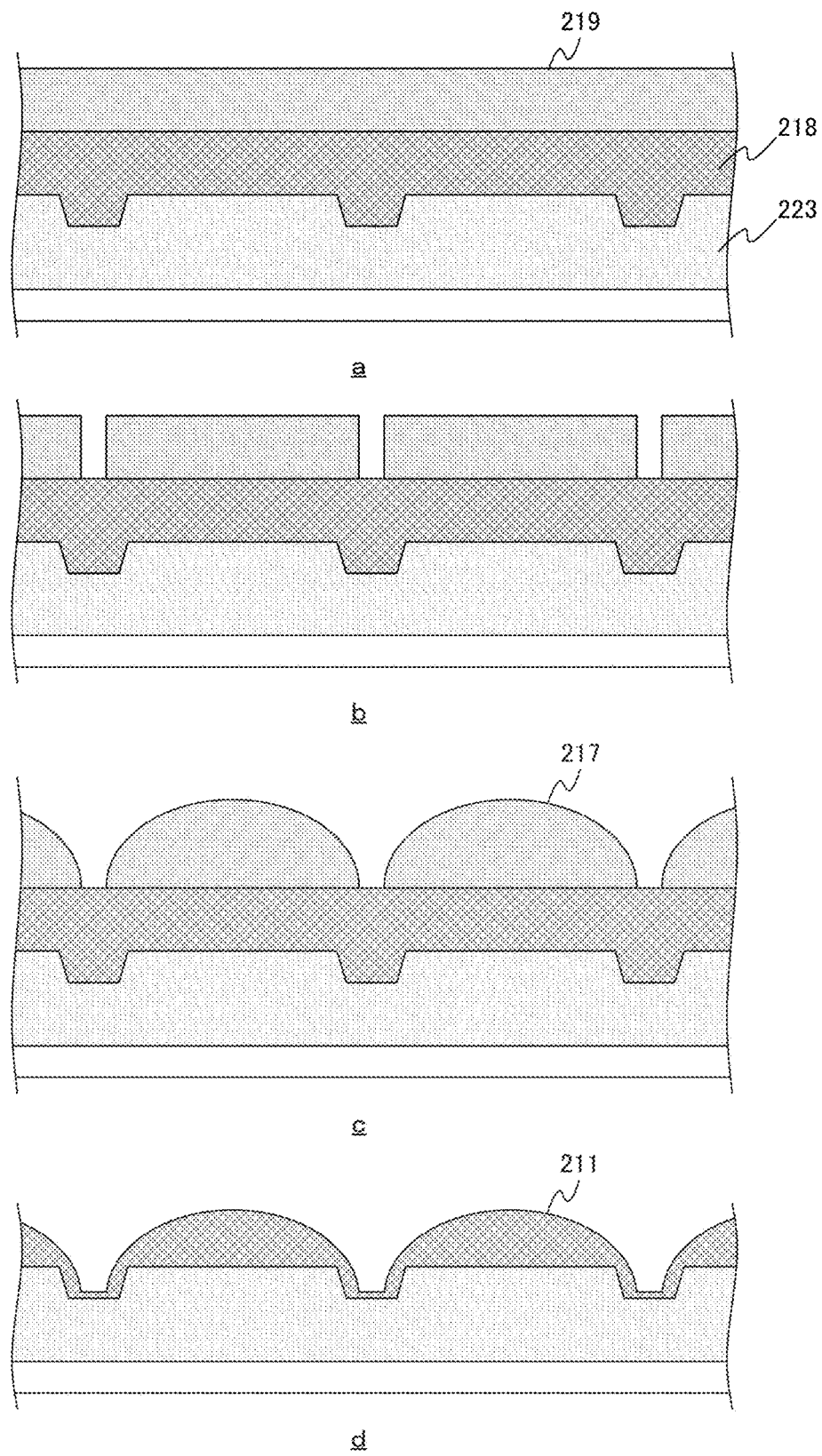
FIG. 6 is a figure depicting an example of a producing method for an on-chip lens in an embodiment of the present technology.

FIG. 6 is a figure depicting an example of a producing method for the on-chip lens in an embodiment of the present technology. This figure is a figure representing the producing method for the on-chip lenses 211 by taking as an example the section along line C-C' described in a in FIG. 5.

First, in a in FIG. 6, a resin 218 as a material for the on-chip lenses 211 and a photoresist 219 are sequentially applied over the color filter 223 (a of the figure). As the resin 218, there can be used, for example, a styrene resin. In addition, as the photoresist 219, there can be used, for example, a novolak resin.

Next, the photoresist 219 is exposed in a rectangular surface shape, followed by development (b of the figure). Subsequently, the photoresist 219 is heat treated at a temperature equal to or higher than a thermal softening point. This can be performed by, for example, heating the semiconductor substrate 241 with the photoresist 219 applied thereto by use of a reflow furnace or the like. By this heat treatment, photoresists 217 hemispherical in section can be formed (c of the figure).

Next, dry etching is conducted using the photoresists 217 as a mask. As a result, on-chip lenses 211 similar in shape to the photoresists 217 can be formed (d of the figure). Such a producing method for the on-chip lenses by transferring the shape of the photoresists 217 by dry etching is called a dry etching method. Note that a thermal melt flow method can also be applied in which the on-chip lenses 211 are formed by heat treating the resin 218 similarly to the photoresists 217.

[Modification]

While, in producing the aforementioned incident light attenuation sections 222, the photoresist 292 varying in film thickness has been formed using the halftone mask, the incident light attenuation sections 222 can also be formed by other methods.

Figure 7:
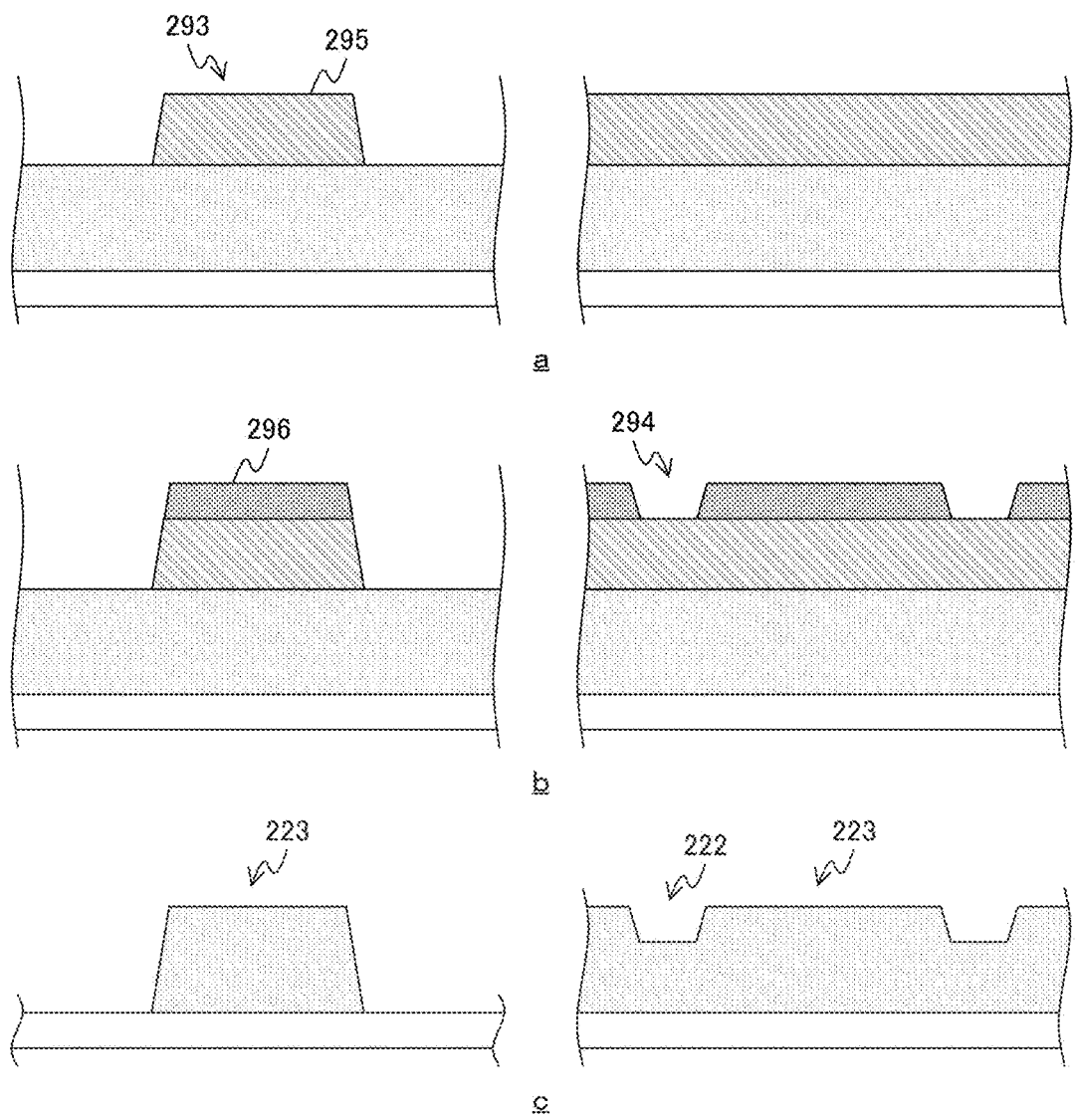
FIG. 7 is a figure depicting an example of a producing method for as incident light attenuation section in a modification of the first embodiment of the present technology.

FIG. 7 is a figure depicting an example of the producing method for the incident light attenuation sections in a modification of the first embodiment of the present technology. First, the photoresist 292 described in a in FIG. 5 is exposed and developed. In this instance, a photomask such as to expose regions other than the regions 293 and 294 described in c in FIG. 5 is used. As a result, a photoresist 295 in a surface shape of the color filter 223 plus the incident light attenuation section 222 can be formed (a of the figure). Next, the photoresist is applied again, and exposure and development are performed. In this instance, a photomask such as to expose regions other than the region 293 is used. As a result, a photoresist 296 in a surface shape similar to that of the color filter 223 can be obtained (b of the figure). Thereafter, dry etching is conducted and the incident light attenuation section 222 can be formed (c of the figure). As described above, by performing each of photoresist application, exposure and development twice, the photoresist 292 having the shape as described in c of FIG. 5 can be formed, and the incident light attenuation sections 222 can be produced.

Figure 8:
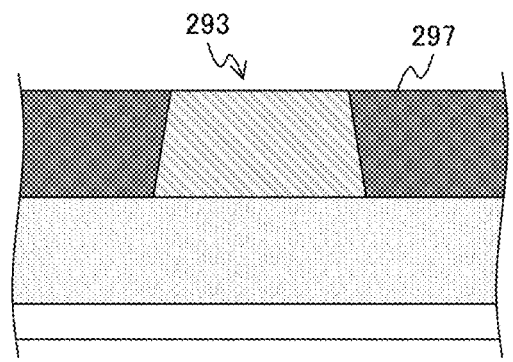
FIG. 8 is a figure depicting another example of the producing method for the incident light attenuation section in the modification of the first embodiment of the present technology.
Figure 8:
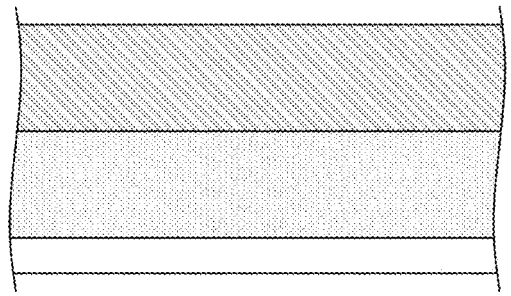
Figure 8:
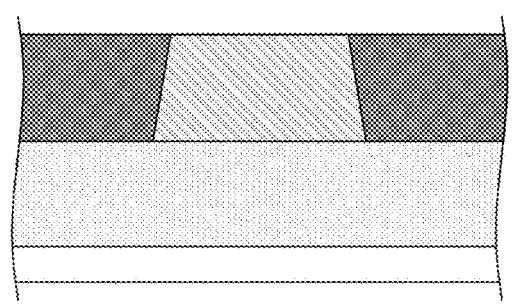
Figure 8:
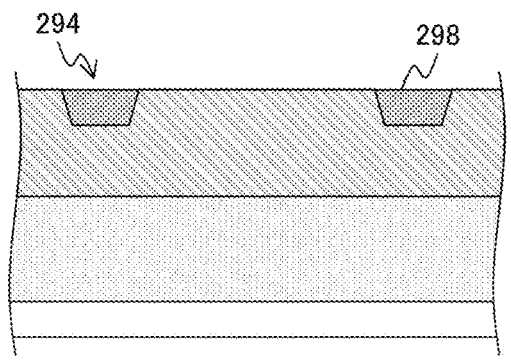
Figure 8:
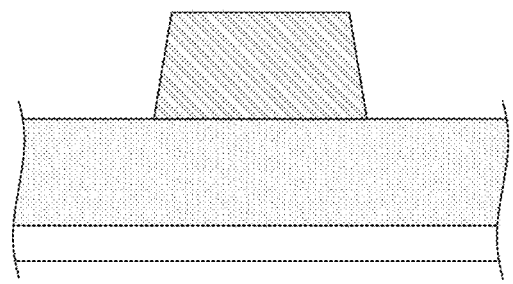
Figure 8:
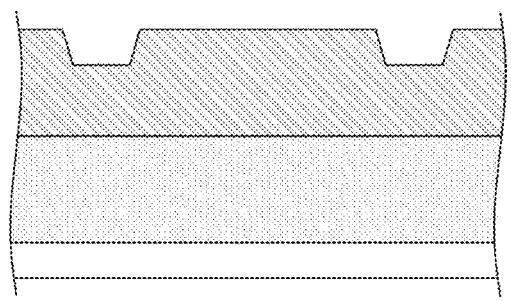
Figure 8:
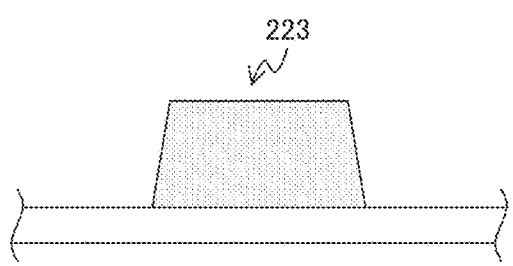
Figure 8:
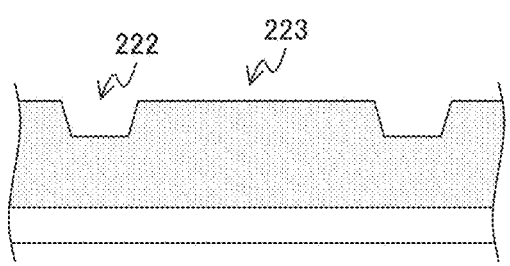

FIG. 8 is a figure depicting another example of the producing method for the incident light attenuation sections in the modification of the first embodiment of the present technology. First, the photoresist 292 described in a of FIG. 5 is subjected to first exposure. In this instance, a photomask such as to expose regions other than the regions 293 and 294 is used. As a result, an exposed region 297 is formed in the photoresist 292 (a of the figure). Next, second exposure is conducted using a photomask such as to expose regions other than the region 293. In this instance, the exposure value is set lower than that of the first exposure. As a result, an exposed region 298 is formed (b of the figure). Thereafter, development is performed (c of the figure). Since the exposure value of the exposed region 298 is lower than that of the exposed region 297, the photoresist 292 after development can have the film thickness of the portion (region 294) of the exposed region 298 be thinner. Thereafter, dry etching is conducted (d of the figure). In this modification, by conducting the exposure twice, the photoresist 292 in the shape described in c of FIG. 5 can be formed.

In this way, in the modification of the first embodiment of the present technology, the incident light attenuation sections 222 can be formed without using a halftone mask.

As described above, the imaging element 2 in the first embodiment of the present technology has a configuration in which the incident light attenuation sections 222 are lower in surface height than the color filter 225, preventing a lowering in sensitivity. Accordingly, image quality can be improved.

2. Second Embodiment

In the imaging element 2 in the first embodiment described above, the incident light attenuation sections 222 lower in surface height than the color filters 223 and the like have been used. In contrast, an imaging element 2 in a second embodiment of the present technology differs from that in the first embodiment in that incident light attenuation sections 222 higher in surface height than the color filters 223 and the like are used.

[Configuration of Pixel]

Figure 9:
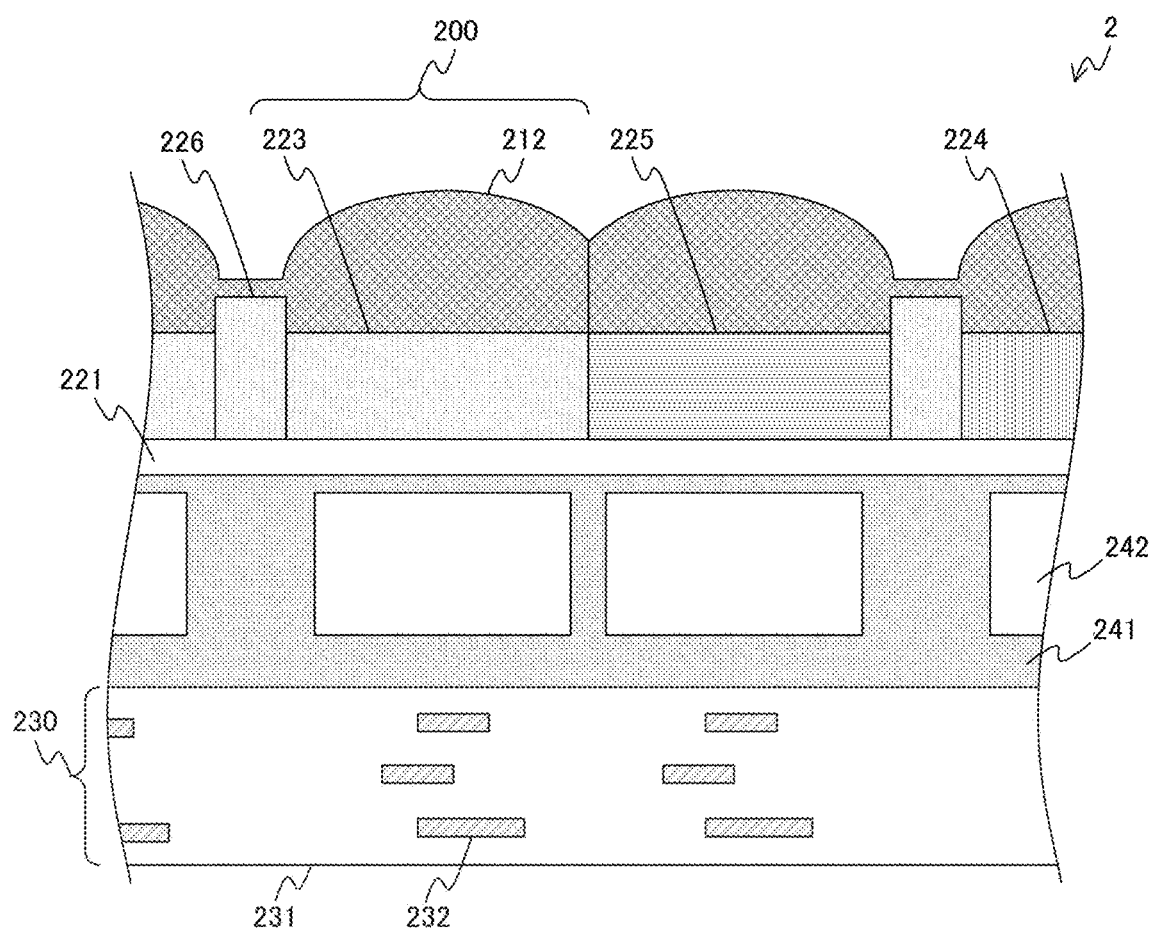
FIG. 9 is a figure depicting a configuration example of a pixel in a second embodiment of the present technology.

FIG. 9 is a figure depicting a configuration example of the pixel in the second embodiment of the present technology. The pixel 200 in the figure differs from the pixel 200 described in FIG. 3 in that it includes incident light attenuation sections 226 in place of the incident light attenuation sections 222.

Unlike the incident light attenuation sections 222, the incident light attenuation sections 226 are configured to be higher in surface height than the color filters 223 to 225. As a result, it is possible to attenuate the light that is obliquely incident on the light receiving surface and is incident on the photoelectric conversion section 242 via the ineffective regions.

Note that while, in the figure, the incident light attenuation section 226 is configured to be substantially equal in width to the ineffective region, it may be smaller in width than the ineffective region. In addition, the incident light attenuation section 226 may be greater in width than the ineffective region.

[Attenuation of Incident Light]

Figure 10:
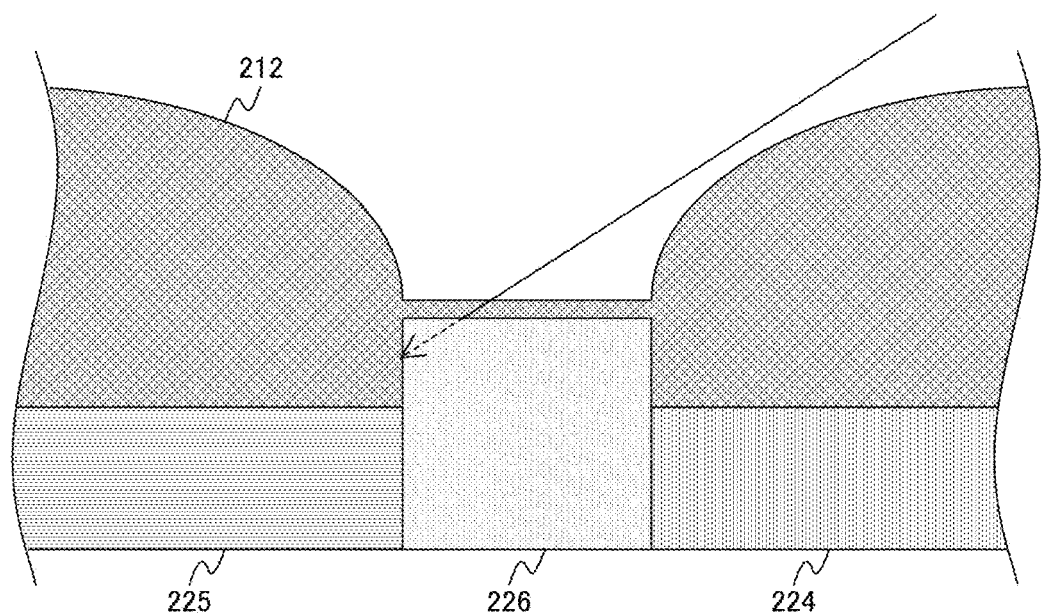
FIG. 10 is a figure depicting an example of incident light in the second embodiment of the present technology.
Figure 10:
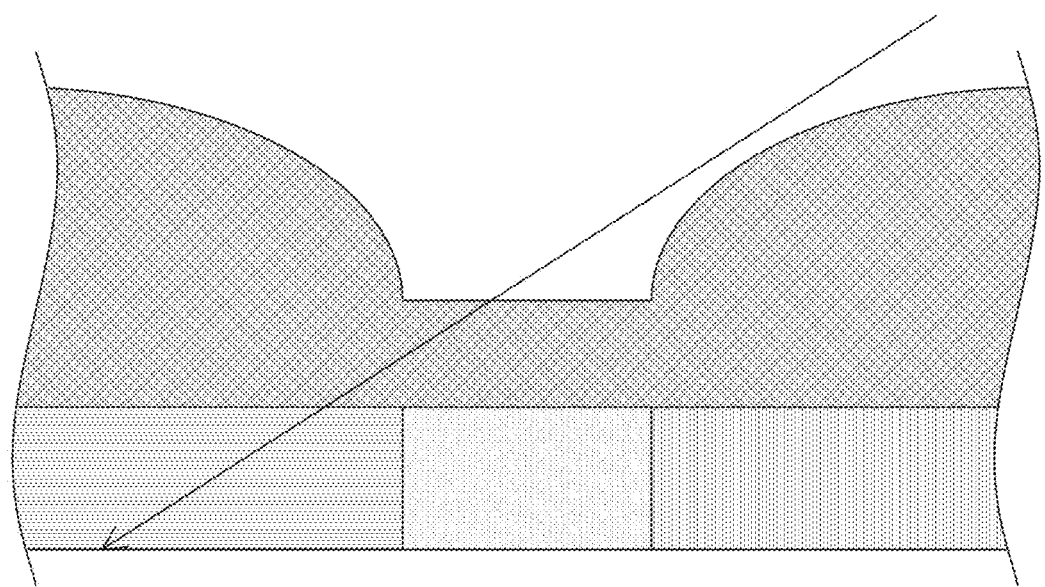

FIG. 10 is a figure depicting an example of incident light in the second embodiment of the present technology. This figure is, similarly to FIG. 4, a figure representing the manner of light incident on a region where the incident light attenuation section 226 is disposed in the pixel 200. In a of the figure, there is represented an example of the case where the incident light attenuation section 222 is higher in surface height than the color filters 225 and the like, and the arrow in a of the figure represents the light obliquely incident on the ineffective region. As represented in a of the figure, the obliquely incident light is attenuated by the incident light attenuation section 226, and, therefore, cannot reach the photoelectric conversion section 242 (not illustrated).

On the other hand, b of the figure represents an example of the case where the incident light attenuation section is equal in surface height to the color filters 225 and the like. In this case, the light obliquely incident on the ineffective region will reach the photoelectric conversion section, without being attenuated.

The ineffective regions formed in the imaging element 2 differ from one another in shape and/or area, and the quantity of light incident on the pixel 200 via the ineffective region varies from pixel 200 to pixel 200. Therefore, by attenuating such incident light incident via the ineffective region, variations in the quantity of incident light from pixel 200 to pixel 200 can be reduced. In addition, in the light obliquely incident on the pixel 200, that light from the subject scattered causing optical noise is contained. By restraining incidence of such light, image quality can be improved.

[Producing Method for Incident Light Attenuation Section]

Figure 11:
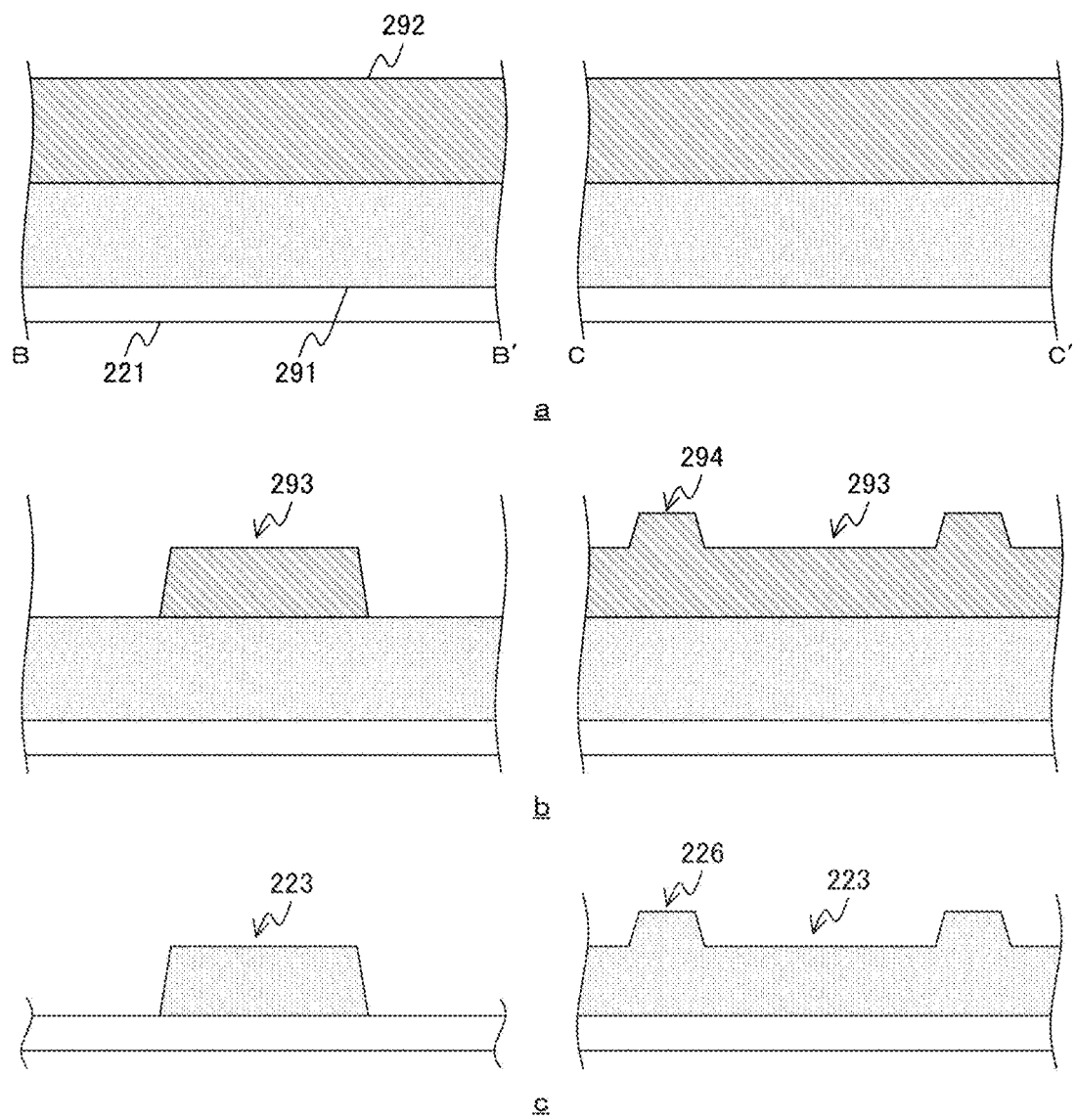
FIG. 11 is a figure depicting an example of a producing method for an incident light attenuation section in the second embodiment of the present technology.

FIG. 11 is a figure depicting an example of a producing method for the incident light attenuation section in the second embodiment of the present technology. First, similarly to FIG. 5, a color resist 291 and a photoresist 292 are sequentially formed on a planarization film 221 (a of the figure). Next exposure is conducted using a halftone mask, followed by development (b of the figure). In this instance, unlike in FIG. 5, a halftone mask in which the portion of a region 293 is higher in transmittance is used. As a result, the film thickness of the photoresist 292 in a region 294 after development can be made greater than that in the region 293. Thereafter, dry etching is conducted, to form a color filter 223 and an incident light attenuation section 226 (c of the figure). Note that as the producing method for the incident light attenuation section 226, there can be applied, for example, the methods described in FIGS. 7 and 8. In addition, it is also possible to use, for example, a negative-type photoresist 292.

The configuration of the imaging element 2 in other points is the same as the configuration of the imaging element 2 described in the first embodiment of the present technology, and, therefore, description is omitted.

As described above, the imaging element 2 in the second embodiment of the present technology has a configuration in which the incident light attenuation sections 222 are higher in surface height than the color filters 223 and the like, making it possible to attenuate the light obliquely incident on the pixel 200 via the ineffective regions. As a result, image quality can be improved.

3. Third Embodiment

In the imaging element in the second embodiment described above, the incident light attenuation section 226 has been disposed in the region of the corner of the four adjacent pixels 200. In contrast, an imaging element 2 is a third embodiment of the present technology differs from that in the second embodiment in that the incident light attenuation section is further disposed in the region of a side of the two adjacent pixels 200.

[Configuration of Imaging Element]

Figure 12:
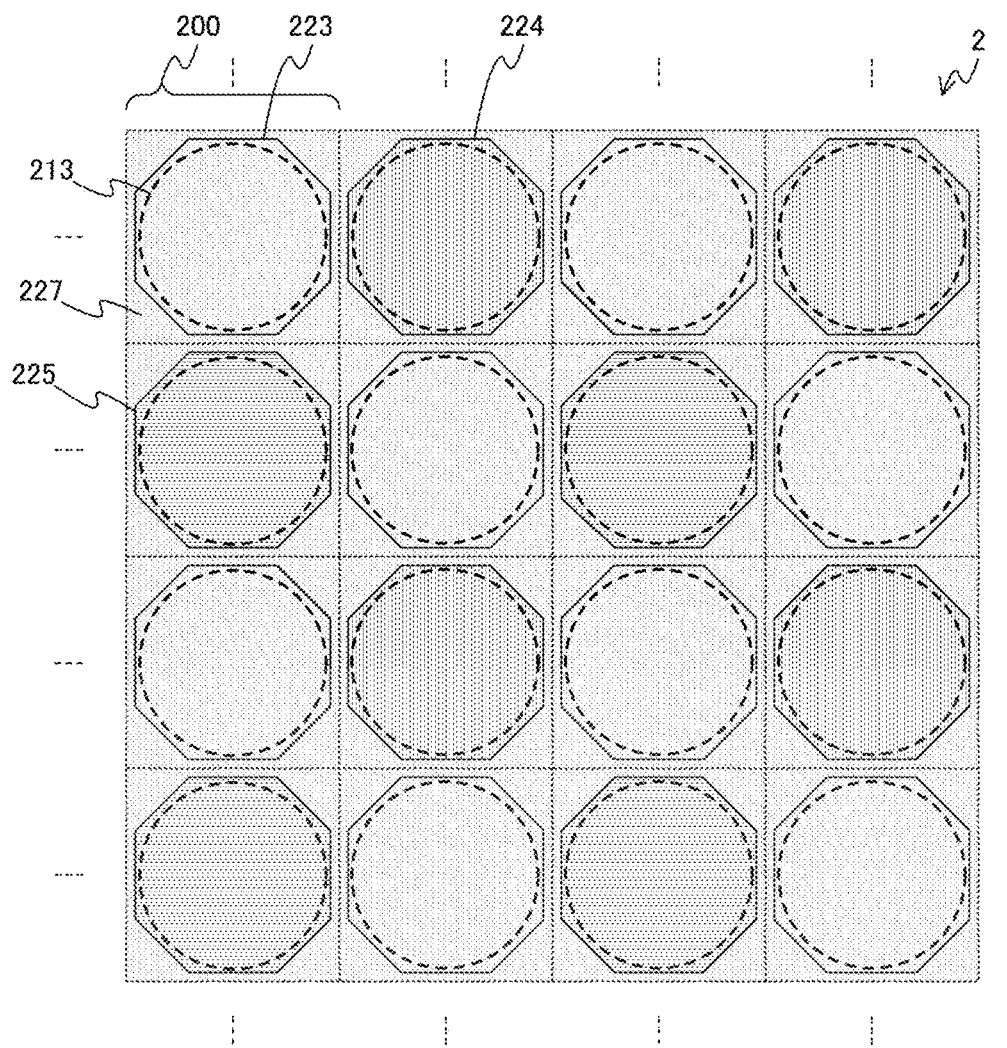
FIG. 12 is a figure depicting a configuration example of an imaging element in a third embodiment of the present technology.

FIG. 12 is a figure depicting a configuration example of the imaging element in the third embodiment of the present technology. The imaging element 2 in the figure differs from the imaging element 2 described in FIG. 2 in the following points. First, the imaging element 2 in the figure includes an on-chip lens 213 in place of the on-chip lens 211. This on-chip lens 213 has a hemispheric shape, and is configured to be separate from the adjacent on-chip lenses 213. Therefore, capability of focusing incident light can be improved. In addition, the imaging element 2 in the figure includes incident light attenuation sections 227 in place of the incident light attenuation sections 222. These incident light attenuation section 227 are disposed in the regions of the corner and the sides of the adjacent pixels 200. In other words, the color filters 223 to 225 in the figure are in a shape of being separated from the color filters of the adjacent pixels 200 by the incident light attenuation sections 227.

In cases such as improving image quality of an image signal generated by the imaging element 2, the on-chip lens 213 having the shape as described above is adopted. In such a case, the ineffective regions are formed in the periphery of the pixel 200. In order to attenuate the incident light via these ineffective regions, the incident light attenuation sections 227 are disposed around the on-chip lens 213. As a result, incidence of light via the ineffective regions can be prevented, and image quality can be improved.

The configuration of the imaging element 2 in other points is the same as the configuration of the imaging element 2 described in the second embodiment of the present technology, and, therefore, description is omitted.

As described above, in the imaging element 2 in the third embodiment of the present technology, by disposing the incident light attenuation sections 222 in the regions of the corner and the sides of the adjacent pixels 200, the light obliquely incident on the pixel 200 via the ineffective regions can be further attenuated, and image quality can be improved.

Note that the configuration of the imaging element 2 is not limited to the above-described examples. For example, a front-illuminated configuration may also be adopted in which color filters 223 and on-chip lenses 211 are formed on a front surface which is a surface where a wiring region 230 of a semiconductor substrate 241 is formed, and light is applied from the front surface to a photoelectric conversion section 242 via the wiring region 230.

Finally, the description of each of the embodiments above is an example of the present technology, and the present technology is not limited to the above-described embodiments. Therefore, even in embodiments other than the above-described embodiments, it is naturally possible to make various modifications according to design and the like, as long as they fall within the scope of the technical idea of the present technology.

Note that the present technology can also take the following configurations.

(1) An imaging element including:

a plurality of pixels including a color filter that transmits incident light having a predetermined wavelength, and a photoelectric conversion section that produces an electric charge according to the light transmitted through the color filter; and an incident light attenuation section that is disposed between the color filters of the adjacent pixels, is configured to be different in surface height from the color filters, and attenuates light not transmitted through the color filter but incident on the photoelectric conversion section of the pixel where the color filter is disposed.

(2) The imaging element according to (1) above, in which the incident light attenuation section is lower in surface height than the color filters.

(3) The imaging element according to (1) above, in which the incident light attenuation section is higher in surface height than the color filters.

(4) The imaging element according to any one of (1) to (3) above, further including:
an on-chip lens that is disposed adjacently to the color filter on the basis of a plurality of pixels, focuses the incident light and causes the focused light to be incident on the color filter, in which
the incident light attenuation section is disposed adjacently to the on-chip lens.

(5) The imaging element according to any one of (1) to (4) above, in which
the incident light attenuation section is disposed in a region of a corner of the four adjacent pixels.

(6) The imaging element according to any one of (1) to (5) above, in which
the incident light attenuation section is disposed in a region of a side of the two adjacent pixels.

(7) An imaging apparatus including:
a plurality of pixels including a color filter that transmits incident light having a predetermined wavelength, and a photoelectric conversion section that produces an electric charge according to the light transmitted through the color filter;
an incident light attenuation section that is disposed between the color filters of the adjacent pixels, is configured to be different in surface height from the color filters, and attenuates light not transmitted through the color filter but incident on the photoelectric conversion section of the pixel where the color filter is disposed; and
a processing section that processes an image signal which is a signal according to the produced electric charge.

REFERENCE SIGNS LIST

1 Imaging apparatus
2 imaging element
3 Vertical drive section
4 Column signal processing section
5 Control section
200 Pixel
211 to 213 On-chip lens
221 Planarization film
222, 226, 227 Incident light attenuation section
223 to 225 Color filter
230 Wiring region
241 Semiconductor substrate
242 Photoelectric conversion section

The invention claimed is:
1. An imaging element, comprising:
a plurality of pixels each including:
    a color filter that transmits incident light having a predetermined wavelength;
    a photoelectric conversion section that produces an electric charge according to the light transmitted through the color filter; and
    an on-chip lens that is disposed in an adjacent manner to the color filter based on the plurality of pixels,
    wherein the on-chip lens focuses the incident light and causes the focused light to be incident on the color filter; and
    an incident light attenuation section that is disposed between color filters of adjacent pixels,
wherein the incident light attenuation section is configured to be different in surface height from the color filter and attenuates light not transmitted through the color filter but incident on the photoelectric conversion section of the pixel where the color filter is disposed,
wherein the on-chip lens is in contact with an entire upper surface of the incident light attenuation section, and
wherein in a cross-sectional view, at least one top curved end portion of the on-chip lens extends below an upper surface of the color filter and is in contact with the upper surface of the incident light attenuation section.

2. The imaging element according to claim 1, wherein the incident light attenuation section is lower in surface height than the color filter.

3. The imaging element according to claim 1, wherein the incident light attenuation section is higher in surface height than the color filter.

4. The imaging element according to claim 1,
wherein the incident light attenuation section is disposed adjacent to the on-chip lens.

5. The imaging element according to claim 1, wherein the incident light attenuation section is disposed in a region of a corner of four adjacent pixels.

6. The imaging element according to claim 1, wherein the incident light attenuation section is disposed in a region of a side of two adjacent pixels.

7. The imagining element according to claim 1, further comprising a planarization film provided between the photoelectric conversion section and the color filter.

8. An imaging apparatus, comprising:
a plurality of pixels each including:
    a color filter that transmits incident light having a predetermined wavelength;
    a photoelectric conversion section that produces an electric charge according to the light transmitted through the color filter; and
    an on-chip lens that is disposed in an adjacent manner to the color filter on a basis of the plurality of pixels,
    wherein the on-chip lens focuses the incident light and causes the focused light to be incident on the color filter;
an incident light attenuation section that is disposed between the color filters of adjacent pixels,
wherein the incident light attenuation section is configured to be different in surface height from the color filters and attenuates light not transmitted through the color filter but incident on the photoelectric conversion section of the pixel where the color filter is disposed,
wherein the on-chip lens is in contact with an entire upper surface of the incident light attenuation section, and
wherein in a cross-sectional view, at least one top curved end portion of the on-chip lens extends below an upper surface of the color filter and is in contact with the upper surface of the incident light attenuation section; and
a processing section that processes an image signal which is a signal according to the produced electric charge.

9. The imaging apparatus according to claim 8, wherein the incident light attenuation section is lower in surface height than the color filter.

10. The imaging apparatus according to claim 8, wherein the incident light attenuation section is higher in surface height than the color filter.

11. The imaging apparatus according to claim 8, wherein the incident light attenuation section is disposed adjacent to the on-chip lens.

12. The imaging apparatus according to claim 8, wherein the incident light attenuation section is disposed in a region of a corner of four adjacent pixels.

13. The imaging apparatus according to claim 8, wherein the incident light attenuation section is disposed in a region of a side of two adjacent pixels.

14. The imaging apparatus according to claim 8, further comprising a planarization film provided between the photoelectric conversion section and the color filter.

15. An imaging element, comprising:
a plurality of pixels each including:
   a color filter that transmits incident light having a predetermined wavelength;
   a photoelectric conversion section that produces an electric charge according to the light transmitted through the color filter; and
   an on-chip lens that is disposed in an adjacent manner to the color filter; and
an incident light attenuation section that is disposed between color filters of adjacent pixels,
wherein the incident light attenuation section is configured to be different in surface height from the color filter,
wherein the on-chip lens is in contact with an entire upper surface of the incident light attenuation section, and
wherein in a cross-sectional view, at least one top curved end portion of the on-chip lens extends below an upper surface of the color filter and is in contact with the upper surface of the incident light attenuation section.

16. The imaging element according to claim 15, wherein the incident light attenuation section is lower in surface height than the color filter.

17. The imaging element according to claim 15, wherein the incident light attenuation section is higher in surface height than the color filter.

18. The imaging element according to claim 15, wherein the incident light attenuation section is disposed adjacent to the on-chip lens.

19. The imaging element according to claim 15, wherein the incident light attenuation section is disposed in a region of a corner of four adjacent pixels.

20. The imaging element according to claim 15, wherein the incident light attenuation section is disposed in a region of a side of two adjacent pixels.

* * * * *